United States Patent
Hirose et al.

(10) Patent No.: US 10,199,557 B2
(45) Date of Patent: Feb. 5, 2019

(54) PIEZOELECTRIC FILM, PIEZOELECTRIC FILM ELEMENT, PIEZOELECTRIC ACTUATOR, PIEZOELECTRIC SENSOR, HARD-DISK DRIVE AND INK JET PRINTER HEAD

(71) Applicant: TDK CORPORATION, Tokyo (JP)

(72) Inventors: Yuiko Hirose, Tokyo (JP); Shirou Ootsuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 90 days.

(21) Appl. No.: 15/280,469

(22) Filed: Sep. 29, 2016

(65) Prior Publication Data

US 2017/0098756 A1  Apr. 6, 2017

(30) Foreign Application Priority Data

Oct. 2, 2015 (JP) .................. 2015-196364

(51) Int. Cl.
| | | |
|---|---|---|
| H01L 41/08 | (2006.01) | |
| H01L 41/187 | (2006.01) | |
| B41J 2/14 | (2006.01) | |
| H01L 41/09 | (2006.01) | |
| H01L 41/113 | (2006.01) | |
| H01L 41/316 | (2013.01) | |

(52) U.S. Cl.
CPC ...... H01L 41/0805 (2013.01); B41J 2/14153 (2013.01); B41J 2/14233 (2013.01); H01L 41/187 (2013.01); H01L 41/1873 (2013.01); B41J 2002/14354 (2013.01); H01L 41/0973 (2013.01); H01L 41/1132 (2013.01); H01L 41/316 (2013.01)

(58) Field of Classification Search
CPC .................. H01L 41/0805; H01L 41/187
See application file for complete search history.

(56) References Cited

U.S. PATENT DOCUMENTS

| | | | |
|---|---|---|---|
| 2009/0096328 A1 | 4/2009 | Shibata et al. | |
| 2009/0121374 A1* | 5/2009 | Shibata | C04B 35/495 |
| | | | 264/40.1 |

(Continued)

FOREIGN PATENT DOCUMENTS

| | | |
|---|---|---|
| CN | 102823007 A | 12/2012 |
| DE | 102010009461 A1 | 9/2011 |

(Continued)

OTHER PUBLICATIONS

Yali Li et al., "Preparation of textured K2BiNb5O15 ceramics with rod-like templates by the screen-printing technique," Journal of Alloys and Compounds 509 (2011), L203-L207.

*Primary Examiner* — J. San Martin
(74) *Attorney, Agent, or Firm* — Oliff PLC

(57) ABSTRACT

A piezoelectric film containing $(K,Na)NbO_3$ as the main component, wherein, when a surface of the piezoelectric film was observed in a field view within a specified range, a plurality of first crystals and a plurality of second crystals are arranged in the surface of the piezoelectric film, wherein, the first crystal has a slender shape orientating toward the first orientation along the surface, and the second crystal has a slender shape orientating toward the second orientation which crosses with the first orientation along the surface.

12 Claims, 5 Drawing Sheets

(56) References Cited

U.S. PATENT DOCUMENTS

| | | | | |
|---|---|---|---|---|
| 2010/0320874 A1* | 12/2010 | Suenaga | ............ | H01L 41/1873 310/357 |
| 2014/0049138 A1* | 2/2014 | Shiraki | ................ | C04B 35/495 310/330 |
| 2014/0084754 A1* | 3/2014 | Maejima | ................ | H01L 41/04 310/367 |
| 2014/0339961 A1* | 11/2014 | Maejima | ............ | H01L 41/0805 310/358 |
| 2017/0133581 A1* | 5/2017 | Kobayashi | ............. | C01G 25/00 |

FOREIGN PATENT DOCUMENTS

| | | | | |
|---|---|---|---|---|
| DE | 102010041567 A1 * | 3/2012 | ........... | C04B 35/495 |
| JP | 2009-117785 A | 5/2009 | | |

* cited by examiner

PIEZOELECTRIC FILM, PIEZOELECTRIC FILM ELEMENT, PIEZOELECTRIC ACTUATOR, PIEZOELECTRIC SENSOR, HARD-DISK DRIVE AND INK JET PRINTER HEAD

The present invention relates to a piezoelectric film element using a piezoelectric film, a piezoelectric actuator using the piezoelectric film element, a piezoelectric sensor, and a hard-disk drive the piezoelectric actuator and an ink jet printer head comprising the piezoelectric actuator.

BACKGROUND

In recent years, the demand for lead free in a piezoelectric material is increasing, and thus the researches on the preparation of the high-quality film using potassium sodium niobate [(K, Na)NbO$_3$ (hereinafter also referred to as KNN)] based material and on the application of the film in the elements are actively developed. The KNN based material has a relatively high curie temperature and good piezoelectric properties in lead-free piezoelectric material, so it is expected to be used in piezoelectric film element.

As the application in the piezoelectric film element, for example, there are piezoelectric sensors which uses the piezoelectric effect that the force applied to the piezoelectric film is converted into a voltage. Particularly, a gyro sensor, a pressure sensor, a pulse wave sensor, a shock sensor, a microphone or the like can be listed. On the other hand, as the piezoelectric actuator where inverse piezoelectric effect is involved, a hard disk drive head, an ink jet head, or a loudspeaker, a buzzer, a resonator and the like where the inverse piezoelectric effect is involved similarly, wherein, the inverse piezoelectric effect is an effect by which the piezoelectric film will be deformed when a voltage is applied.

If the piezoelectric material is made as a film, the element may be downsized and can be used in more fields. In addition, as a plurality of elements can be prepared in a substrate in a lump, the productivity is increased. Further, there are lots of advantages in terms of performance such as the enhancement of the sensitivity when the piezoelectric material is prepared to be a sensor.

In order to obtain a good piezoelectric property, a piezoelectric film with a high quality is required. However, sometimes warp will occur in the piezoelectric film by the heating deposition because the difference of the coefficient of thermal expansion between the substrate and the piezoelectric film. The elements using such a piezoelectric film with warp may have a risk that their piezoelectric property will decrease when they are driven consecutively.

When facing the problem mentioned above, the technology described in Patent 1 took the difference of the coefficient of thermal expansion between the piezoelectric film made from KNN based material and the substrate into consideration, and prevented the decreasing of the piezoelectric property during consecutive driving by making the warp under the room temperature have a curvature radius of 10 m or above.

Patent Documents

Patent Document 1: JP-2009-117785

SUMMARY

However, in Patent Document 1, during the preparation process of the element using the piezoelectric film made from KNN based materials, there are potential damages such as micro-cracks or the like. There may be a risk that the reliability will decrease when the element was driven consecutively.

The present invention is completed in view of the technical problems in the prior art and aims to provide a piezoelectric film which can prevent the damage during the processing process and also a piezoelectric film element having the piezoelectric film with a high reliability.

That is, the present invention is characterized in that, in the piezoelectric film using (K,Na)NbO$_3$ as the main component, when the surface of the piezoelectric film was observed in a field view within a specified range, a plurality of first crystals and a plurality of second crystals are arranged, wherein, the first crystal has a slender shape orientating toward the first orientation along the surface, and the second crystal has a slender shape orientating toward the second orientation which crosses with the first orientation along the surface.

In this way, damages including extension of the micro-cracks during the processing process can be suppressed. In addition, the piezoelectric film element using such a piezoelectric film can prevent the fatigue deterioration during the consecutive driving caused by the damage mentioned above. As a result, a high reliability can be obtained.

According to the present invention, a piezoelectric film which can suppress the damage during the processing process and also a piezoelectric film element using the piezoelectric film with a high reliability can be provided, for example, a piezoelectric actuator, a piezoelectric sensor, a hard disk drive or an ink jet printer head having the piezoelectric actuator or the piezoelectric sensor.

DETAILED DESCRIPTION OF EMBODIMENTS

Figure 1:
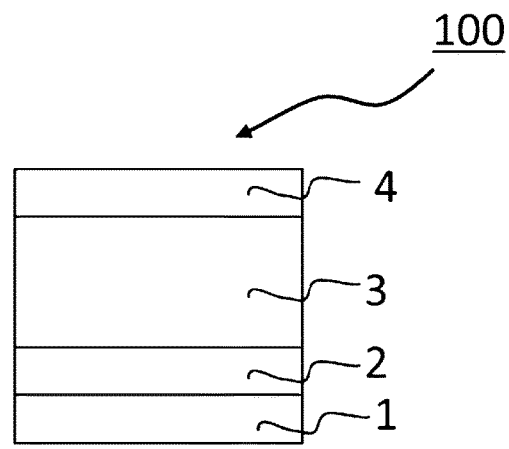
FIG. 1 is a view showing the configuration of the piezoelectric film element in one embodiment of the present invention.

Hereinafter, a preferable embodiment of the present invention will be described in detail with reference to the drawings. Further, the same or equivalent elements in the drawings are marked with the same symbol. In addition, the positional relationships are shown in the drawings. Further, repeated descriptions will be omitted.

(Piezoelectric Film Element)

FIG. 1 shows an example of the layer constitution of the piezoelectric film element in the present embodiment. Piezoelectric film element 100 is provided with a substrate 1, a lower electrode layer 2, a piezoelectric film 3 deposited on the lower electrode layer 2, an upper electrode layer 4 formed on the piezoelectric film 3. That is, the piezoelectric film element 100 is a structure containing a pair of electrode layers with piezoelectric film 3 sandwiched therebetween.

As the material used in the substrate 1 for example, a substrate of single crystal silicon, a substrate of silicon on insulator (SOI), a substrate of silica glass, a semi-conductive substrate composed of GaAs or the like, a metallic substrate composed of stainless steel or the like, or a substrate of single crystal oxide such as a MgO substrate, a $SrTiO_3$ substrate, and the like can be listed. The thickness of substrate 1 is usually 10 to 1000 µm.

On substrate 1, lower electrode layer 2 with a thickness of 0.05 µm to 1.0 µm is formed. As the material for lower electrode layer 2, metallic materials such as Pt (platinum), Pd (palladium), Rh (rhodium), Au (gold), Ru (ruthenium), Ir (iridium), Mo (molybdenum), Ti (titanium), Ta (tantalum), Ni (Nickel) and the like, or conductive oxides of metals such as $SrRuO_3$, $LaNiO_3$ and the like can be listed. Lower electrode layer 2 can be formed through sputtering method, vacuum evaporation, printing method, spin coating method, sol-gel method and the like.

Piezoelectric film 3 uses perovskite type oxide represented by $(K,Na)NbO_3$ as the main component. For example, it can be formed through sputtering method. The thickness of the film can be about 1 µm to 10 µm as an example. Piezoelectric film 3 will be specifically described separately.

At last, on piezoelectric film 3, upper electrode layer 4 with a thickness of 0.05 µm to 1.0 µm is formed. As the material for upper electrode layer 4, metallic materials such as Pt, Pd, Rh, Au, Ru, Ir, Mo, Ti, Ta, Ni and the like, or conductive oxides of metals such as $SrRuO_3$, $LaNiO_3$ and the like can be listed. Upper electrode layer 4 can be formed through sputtering method, vacuum evaporation, printing method, spin coating method, sol-gel method and the like.

Piezoelectric film element 100 can be coated by a protective film. In this way, the reliability can be improved.

In piezoelectric film element 100, a intermediate layer can be presented in either or both of the space between lower electrode layer 2 and piezoelectric film 3 and the space between upper electrode layer 4 and piezoelectric film 3.

After patterned by method such as photolithography, dry etching and wet etching into a size of 25 mm×5 mm which is not particularly restricted, individual pieces of piezoelectric film element 100 can be obtained by cutting substrate 1.

Herein, piezoelectric film 3 is described. The piezoelectric film uses $(K,Na)NbO_3$ as the main component. In addition, the main component refers to 70 wt. % of the whole component of piezoelectric film 3. The ratio of the constitution elements is not specified, but it is preferred that $Na/(K+Na) \geq 0.5$. Further, the piezoelectric film of the present embodiment is preferred to contain at least one element selected from the group consisting of Ta, Zr and Mn besides the main component. As the effect brought by the adding of these elements, for example, the breakdown characteristics may be improved compared with that of the matrix composition.

Figure 2A:
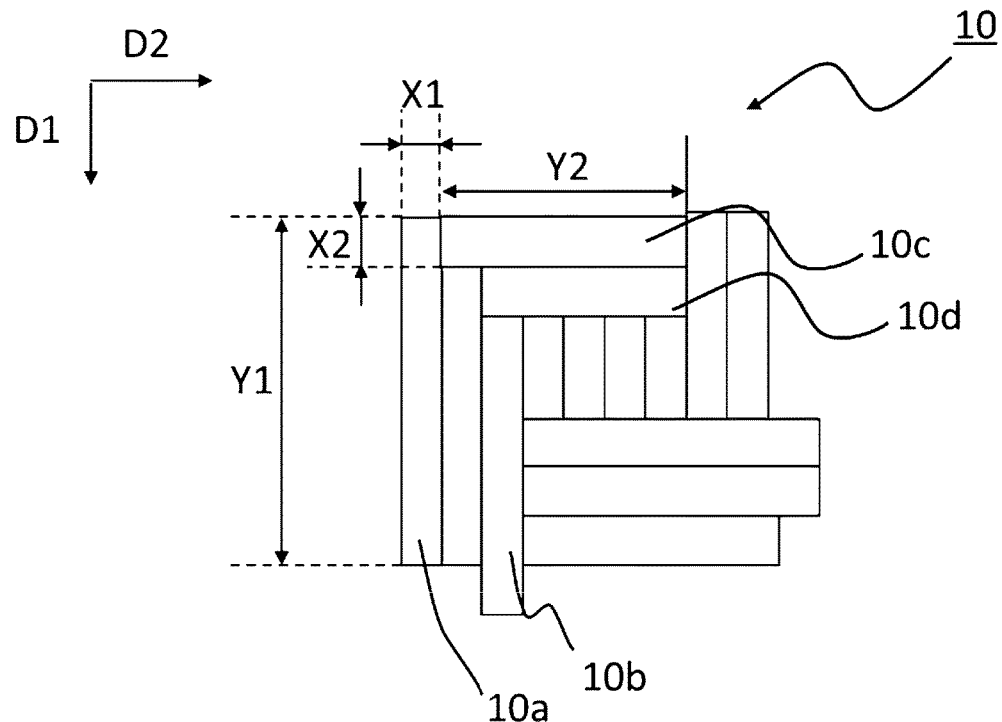
FIG. 2A is a schematic view of the surface of the piezoelectric film in one embodiment of the present invention.

The schematic view of the surface of the piezoelectric film in the present embodiment is shown in FIG. 2A. In surface 10 of the piezoelectric film, several crystals 10a and 10b having a slender shape are arranged toward the first orientation D1; on the other hand, several crystals 10c and 10d having a slender shape are arranged toward the second orientation D2. Herein, the crystal having a slender shape toward the first orientation D1 is referred as the first crystal, and the crystal having a slender shape toward the second orientation D2 is referred as the second crystal. Further, the first crystals and the second crystals are the same kind of crystal. On the other hand, the first orientation D1 is any orientation along the surface orientation of the film, and the second orientation D2 refers to any orientation having a relationship of "crossing" with the first orientation D1.

Figure 2B:
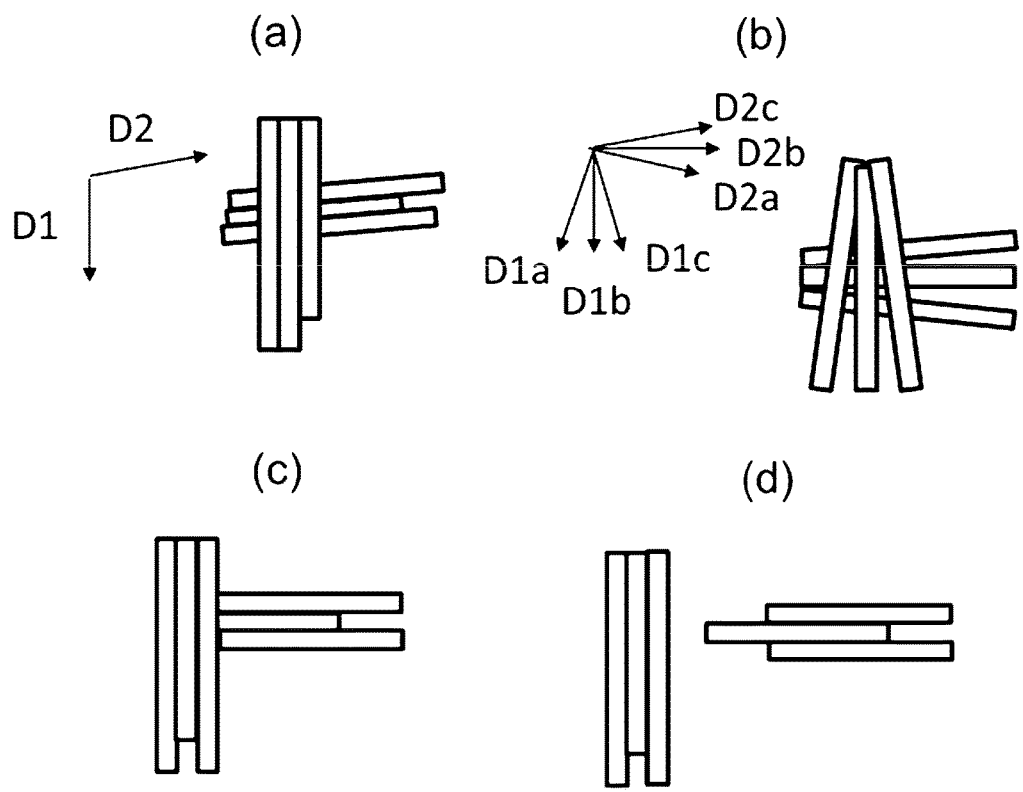
FIG. 2B is a schematic view of the surface of the piezoelectric film in one embodiment of the present invention.

Herein, the "crossing" of the present embodiment is described using FIG. 2B. As shown in FIG. 2B (a), the "crossing" refers to a condition that the first crystal having a slender shape in the first orientation D1 slightly perpendicularly crosses with the second crystal having a slender shape in the second orientation D2. "Slightly perpendicular" refers to a range that the angle between the first orientation and the second orientation is 75° or more and 105° or less. In the crossing point or the contacting point of the crystals, damages such as the extension of the micro-cracks during the processing process can be prevented.

In the present embodiment, all of the following cases are referred as "crossing", i.e., the case where several existing second crystals slightly perpendicularly cross with the first crystals in different angles respectively as shown in FIG. 2B(b), the case where the first crystals and the second crystals contact with each other slightly perpendicularly as shown in FIG. 2B(c), and the case where the extension lines of the long side of one of the first crystals and the second crystals slightly perpendicularly cross with the other crystals, even though the two kinds of crystals do not contact with each other as shown in FIG. 2B(d). In the case of FIG. 2B(d), the distance between the first crystal and the second crystal is preferred to be a distance less than both of the average value of the lengths Y1 of the long side of the first crystals and the average value of the lengths Y2 of the long side of the second crystals.

The surface can be observed by using probe microscopes or the like such as scanning electron microscope or the like. Specifically, the surface of the piezoelectric film is observed in a view field of 10 µm×10 µm using an atomic force microscopy (AFM).

In the present embodiment, the reason why the damage during the processing of the piezoelectric film is not necessarily clear, but it is presumed as follows.

Usually, it is known that in the grain boundary between the crystal grains, the mechanical strength is lower than that in the gains because of the misfit or the like in the crystal lattice, thus, the crack will extent along the grain boundary easily. Therefore, for example the extension of the micro-cracks in the plane of the piezoelectric film during the processing process can be prevented by having the arrangement mentioned above and the potential damages can be prevented. In addition, the piezoelectric film element using such a piezoelectric film can prevent the fatigue deterioration during the consecutive driving caused by the damage mentioned above, and as a result, a high reliability can be obtained. However, the mechanism is not restricted by this.

The accessory photo software attached on the AFM is used to calculate the length X1 of the short side, the length Y1 of the long side of the first crystal, and the length X2 of the short side, the length Y2 of the long side of the second crystal in the observed field of view, the ratio of the length Y1 of the long side when the length X1 of the short side is 1 in the first crystal, and the ratio of the length Y2 of the long side when the length X2 of the short side is 1 in the second crystal (i.e., the aspect ratios of Y1/X1 (first aspect ratio) and Y2/X2 (second aspect ratio) of the first crystal and the second crystal) are calculated respectively. When the average value of the aspect ratio Y1/X1 of the first crystal and the average value of the aspect ratio Y2/X2 of the second crystal in the observed field of view is calculated, it is preferred that both of the average value of the aspect ratio Y1/X1 and the average value of the aspect ratio Y2/X2 are in a range of 2 or more, and more preferable in a range of 2 or more and 15 or less. In this way, the damages during the processing process can be prevented, and a higher reliability can be obtained even in a piezoelectric film element.

The average value of the length X1 of the short side and the average value of the length Y1 of the long side of the first crystal, and the average value of the length X2 of the short side and the average value of length Y2 of the long side of the second crystal in the observed field of view are calculated respectively. In addition, the crystals with a part not been contained in the observed field of view is not counted for calculating the average values. The average values of the lengths of the long side Y1, Y2 are both preferred to be 2 µm or less. In this way, the damages during the processing process can be prevented, and a higher reliability can be obtained even in a piezoelectric film element.

Further, the total area of the first crystal and the second crystal of the surface of the piezoelectric film in the observed field of view is measured so that the total area ratio S is calculated. The total area ratio S refers to the value obtained by dividing the sum of the areas of the first crystal and the second crystal by the sum of the area of the total crystals contained in the observed field of view. Here, the total area ratio S is preferred to be 70% or more. In this way, the damages during the processing process can be prevented, and a higher reliability can be obtained even in a piezoelectric film element.

The number α of the first crystals and the number β of the second crystals in the surface of the piezoelectric film contained in the observed field of view are calculated and the ratio α/(α+β) is calculated. In addition, the crystals with a part not been contained in the observed field of view is not contained in α and β. Here, α/(α+β) is preferred to be 0.3 or more and 0.7 or less. In this way, for example, the damages during the processing process can be prevented, and a higher reliability can be obtained even in a piezoelectric film element.

Hereinafter, the preparation method of the piezoelectric film element 100 in the present embodiment is described.

First, a single crystal silicon substrate is prepared. Then, Pt is deposited on substrate 1 as lower electrode layer 2 by sputtering method. After that, a sputtering target with the composition represented by (K,Na)NbO$_3$ is used for depositing piezoelectric film 3 by sputtering method. As an example of the method for forming the structure of the present embodiment, for example, it can be formed by changing the oxygen concentration or the substrate temperature during the deposition. The oxygen concentration can be set in a range of 0% to 25% and on the other hand, the substrate temperature can be set to a highest temperature of 900° C. However, the present invention is not confined in the above preparation condition of the embodiment. On the piezoelectric film 3 obtained by this method, Pt is deposited by a sputtering method as upper electrode layer 4. Piezoelectric film element 100 is prepared through the processes mentioned above.

(The Observation of the Surface Shape of the Piezoelectric Film)

The surface of piezoelectric film 3 is observed using AFM in a view field of 10 µm×10 µm to determine the first crystal and the second crystal. In addition, in the measurement of the angle, auxiliary lines are drawn respectively for the long sides Y of the representative first crystal and the second crystal and then the angle is calculated.

Thereafter, the length of short side X1 and the length of long side Y1 of the first crystal, and the length of short side X2 and the length of long side Y2 of the second crystal contained in the observed field of view are measured using a photo analyzing software. The ratio of the long side Y1 when the short side X1 is 1 in the first crystal, and the ratio of the long side Y2 when the short side X2 is 1 in the second crystal, i.e., the aspect ratios of Y1/X1 and Y2/X2 of the first crystal and the second crystal are calculated respectively. The average value of the aspect ratio Y1/X1 and the average value of the aspect ratio Y2/X2 of the crystals in the observed field of view are then calculated. When the average values are calculated, optional five pairs of crossing first crystals and second crystals are used as the objects.

The average value of long side Y1 of the first crystal and the average value of long side Y2 of the second crystal in the observed field of view are calculated respectively.

Further, the total area occupied by the first crystal and the second crystal of the surface of the piezoelectric film in the observed field of view is calculated and the total area ratio is calculated.

The number α of the first crystals and the number β of the second crystals of the surface of the piezoelectric film contained in the observed field of view are calculated and the ratio α/(α+β) is calculated.

After the deposition of the upper electrode layer, the area where KNN is appeared on the outermost surface can be performed with a surface observation by AFM. Further, the surface observation can also performed by using instruments other than AFM. The observed area need not to be 10 µm×10 µm as long as it is 3 µm×3 µm or more. The observation can be performed in the area where at least 10 crystals can be observed.

Piezoelectric film element 100 obtained by the method mentioned above using a piezoelectric film in which the damages during the processing process are little, thus, a device can be obtained with a high reliability even if it is used in a piezoelectric actuator element in which the load caused by driving is especially large. Hereinafter, examples of the devices which are suitable for using the piezoelectric film element of the present embodiment are listed for explanation.

(Piezoelectric Actuator)

Figure 3A:
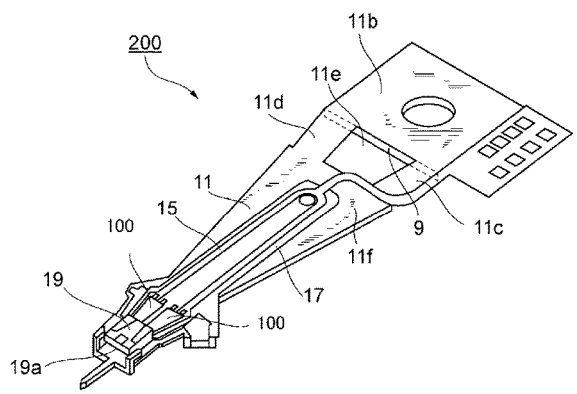
FIG. 3A is a view showing the configuration of the head assembly distributed on the hard disk drive which is an example of the piezoelectric actuator using the piezoelectric film element in one embodiment of the present invention.

FIG. 3A is a view showing the configuration of a head assembly set on a hard-disk drive (hereinafter also referred to as HDD) which is an example of the piezoelectric actuators using the piezoelectric film element of the present embodiment. As shown in this figure, as the main components, head assembly 200 is provided with base plate 9, load beam 11, flexure 17, first and second piezoelectric film elements 100 functioning as the drive elements, and a head slider 19 with a head element 19a.

Load beam 11 is provided with end part 11b adhered to base plate 9 via, for example, beam welding, first plate spring part 11c and second plate spring part 11d elongating from end part 11b with a shape becoming thinner on the front end, opening part 11e formed between first plate spring part 11c and second plate spring part 11d, and a main part of beam 11f elongating from first plate spring part 11c and second part 11d with a linear shape and becoming thinner on the front end.

First and the second piezoelectric film elements 100 are deposited on flexible substrate for wiring 15 (which is part of flexure 17) with a specified spacing. Head slider 19 is fixed to the front end part of flexure 17 and rotates accompanying with the stretching of first and the second piezoelectric film elements 100.

First and the second piezoelectric film elements 100 each is composed of a lower electrode layer, an upper electrode layer and a piezoelectric film sandwiched between the upper electrode layer and the lower electrode layer. In the piezoelectric actuator of the present embodiment, property deterioration will not occur during the processing of the piezoelectric film element, thus, a higher reliability and sufficient displacement amount can be obtained.

Figure 3B:
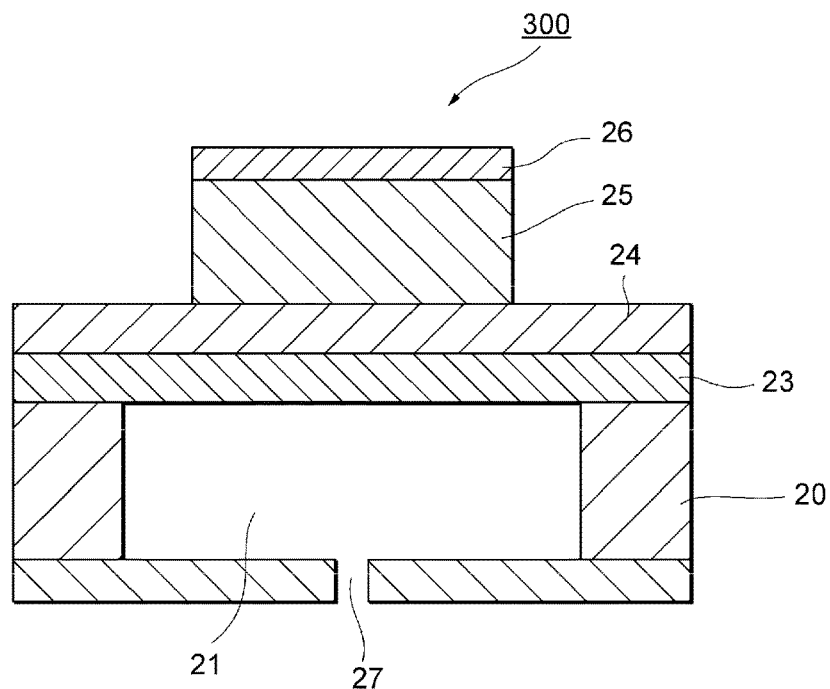
FIG. 3B is a view showing the configuration of the piezoelectric actuator of the ink jet printer head which is another example of the piezoelectric actuator using the piezoelectric film element in one embodiment of the present invention.

FIG. 3B is a view showing the configuration of a piezoelectric actuator of an ink jet printer head which is another example of the piezoelectric actuator using the piezoelectric film element. FIG. 3B shows an application example of piezoelectric film element 100.

Piezoelectric actuator 300 is formed by laminating insulating film 23, lower electrode layer 24, piezoelectric film 25 and upper electrode layer 26 on substrate 20.

When no predetermined spitting out related signal is provided and no voltage is applied between lower electrode layer 24 and upper electrode layer 26, piezoelectric layer 25 will not deform. In pressure chamber 21 with a piezoelectric film element where no spitting out related signal is provided, the pressure will not change and no ink will be spit out from the nozzle 27.

On the other hand, when a predetermined spitting out related signal is provided and a definite voltage is applied between lower electrode layer 24 and upper electrode layer 26, piezoelectric layer 25 will deform. In pressure chamber 21 with a piezoelectric film element where spitting out related signal is provided, insulating film 23 will bend to a large extent. Thus, the pressure within pressure chamber 21 will increase in a very short time and ink will be spit out from nozzle 27.

The piezoelectric film element of the piezoelectric actuator of the present embodiment can prevent damages during preparation, thus, a higher reliability and sufficient displacement amount can be provided.

(Piezoelectric Sensor)

Figure 4A:
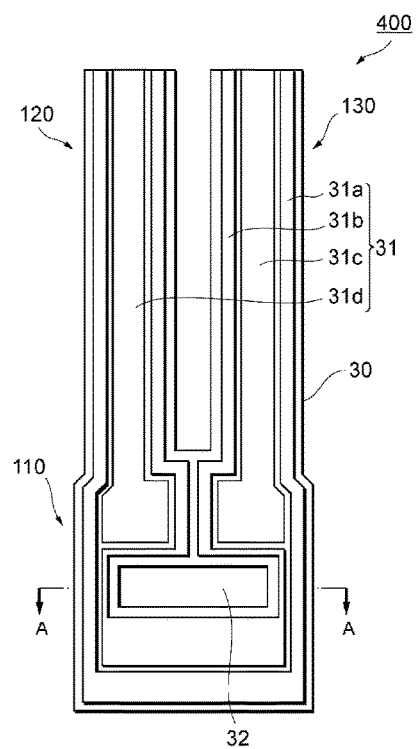
FIG. 4A is a view (planar view) showing the configuration of a gyro sensor which is an example of the piezoelectric sensor using the piezoelectric film element in one embodiment of the present invention.
Figure 4B:
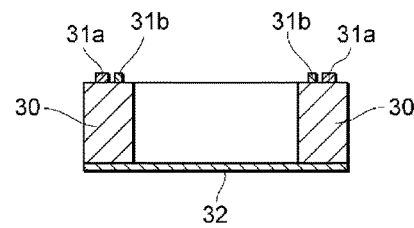
FIG. 4B is a sectional view obtained along the A-A line in FIG. 4A.

FIG. 4A is a view (planer view) showing the configuration of a gyro sensor which is an example of the piezoelectric sensor using the piezoelectric film element mentioned above, and FIG. 4B is a sectional view obtained from the arrow direction along the A-A line of FIG. 4A.

The gyro sensor 400 is a tuning fork oscillator type component for detecting angular velocity and is provided with a base part 110, and two arms 120 and 130 connected to one surface of the base part 110. The gyro sensor 400 is obtained by fine processing a piezoelectric layer 30, an upper electrode layer 31 and a lower electrode layer 32 which constitute the piezoelectric component mentioned above according to the shape of a folk oscillator, and all parts (the base part 110 and the arms 120 and 130) is integrally formed by the piezoelectric film element.

Driving electrode layers 31a and 31b and detecting electrode layer 31d are respectively formed on the first main face of one arm 120. Similarly, driving electrode layers 31a and 31b and detecting electrode layer 31c are respectively formed on the first main face of the other arm 130. These electrode layers 31a, 31b, 31c and 31d are obtained with a specified electrode shape by etching upper electrode layer 31.

In addition, the solid lower electrode layer 32 formed on the second main face (the main face on the back side of the first main face) of each of base part 110 and arms 120 and 130 functions as the ground electrode of gyro sensor 400.

Here, an XYZ rectangular coordinate system is built up based on that the direction along the long edge of each arm 120 or 130 is regarded as the Z direction, and the plane containing the main faces of two arms 120 and 130 are deemed as the XZ plane.

If a driving signal is provided to the driving electrode layers 31a and 31b, these two arms 120 and 130 are excited to vibrate in an in-plane vibration mode. The in-plane vibration mode refers to a vibration mode where the two arms 120 and 130 are excited to vibrate in a direction parallel to the main faces of these two arms 120 and 130. For example, one arm 120 is excited to vibrate with a velocity V1 in the −X direction and the other arm 130 is excited to vibrate with a velocity V2 in the +X direction.

If the gyro sensor 400 is supplied with a rotation of an angular velocity ω in the above state using the Z axis as the rotating axis, the Coriolis force will respectively affects the two arms 120 and 130 in a direction perpendicular to the velocity direction and these two arms will be excited to vibrate in a out-of-plane vibration mode. The out-of-plane vibration mode refers to a vibration mode where the two arms 120 and 130 are excited to vibrate in a direction perpendicular to the main faces of the two arms 120 and 130. For example, when the Coriolis force F1 affecting one arm 120 is in the −Y direction, the Coriolis force F2 affecting the other arm 130 is in the +Y direction.

The Coriolis force F1 or F2 is proportional to the angular velocity ω. In this respect, the mechanical strain of the arms 120 and 130 caused by the Coriolic force F1 and F2 will be converted into electrical signals (detecting signals) through the piezoelectric layer 30. The signals will be read from the detecting electrode layers 31c and 31d so as to calculate the angular velocity ω.

By using a piezoelectric film element with a large displacement amount as the piezoelectric film element used in the piezoelectric sensor of the present embodiment, the electricity consumption can be suppressed and a high reliability and sufficient detecting sensitivity will be provided.

Figure 4C:
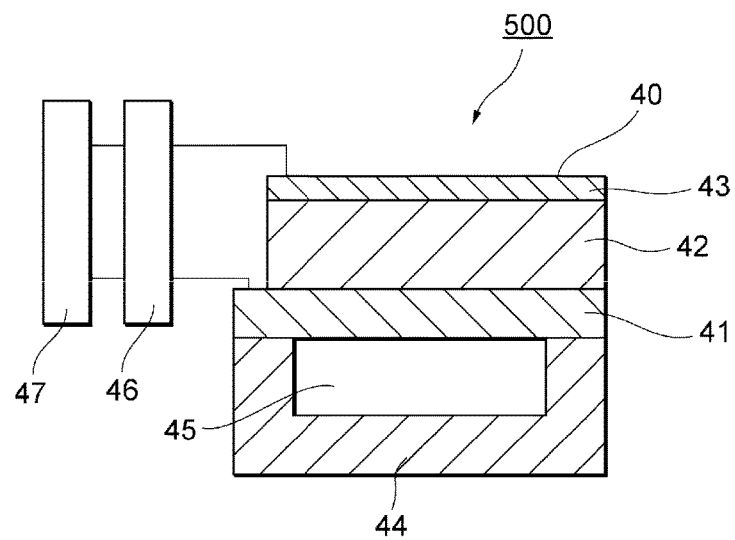
FIG. 4C is a view showing the configuration of a pressure sensor which is the second example of the piezoelectric sensor using the piezoelectric film element in one embodiment of the present invention.

FIG. 4C is a view showing the configuration of a pressure sensor which is a second example of the piezoelectric sensor using the piezoelectric component mentioned above.

The pressure sensor 500 is provided with a hollow space 45 dealing with the incoming pressure and is composed of a supporter 44 for supporting the piezoelectric component 40, a current amplifier 46, and a voltage detector 47. The piezoelectric film element 40 consists of a common electrode layer 41, a piezoelectric layer 42 and an individual electrode layer 43, and these layers are all laminated on the supporter 44 in said order. Here, if a force is applied, the piezoelectric component 40 will bend and the voltage can be detected by the voltage detector 47.

By using a piezoelectric element with a large displacement amount as the piezoelectric film element used in the piezoelectric sensor of the present embodiment, a high voltage endurance and sufficient detecting sensitivity will be provided.

Figure 4D:
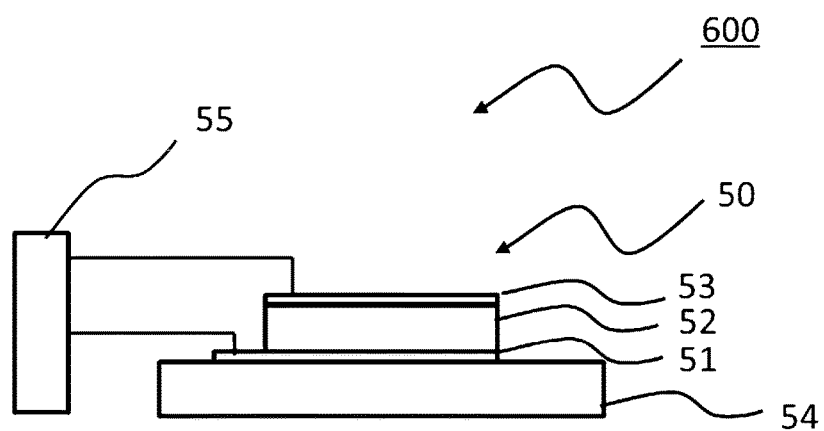
FIG. 4D is a view showing the configuration of a pulse wave sensor which is the third example of the piezoelectric sensor using the piezoelectric film element in one embodiment of the present invention.

FIG. 4D is a view showing the configuration of a pulse wave sensor which is the third example of the piezoelectric sensor using the piezoelectric film element mentioned above.

The pulse sensor 600 contains supporter 54 supporting piezoelectric film element 50 for dealing with the accepted pressure and voltage detector 55. The piezoelectric film element 50 consists of a common electrode layer 51, a piezoelectric film 52 and an individual electrode layer 53, and these layers are all laminated on the supporter 54 in said order. When the pulse of the living body is to be detected, the back of supporter 54 (the plane without piezoelectric film element) of pulse wave sensor 600 is to be contacted with the artery of the living body. In this way, supporter 54 and piezoelectric film element 50 is blended by the pressure caused by the pulse of the living body and the voltage can be detected by voltage detector 55.

The piezoelectric film element used in the piezoelectric sensor of the present embodiment can prevent damages during preparation, thus, a higher reliability and sufficient displacement amount can be provided.

(Hard-Disk Drive)

Figure 5:
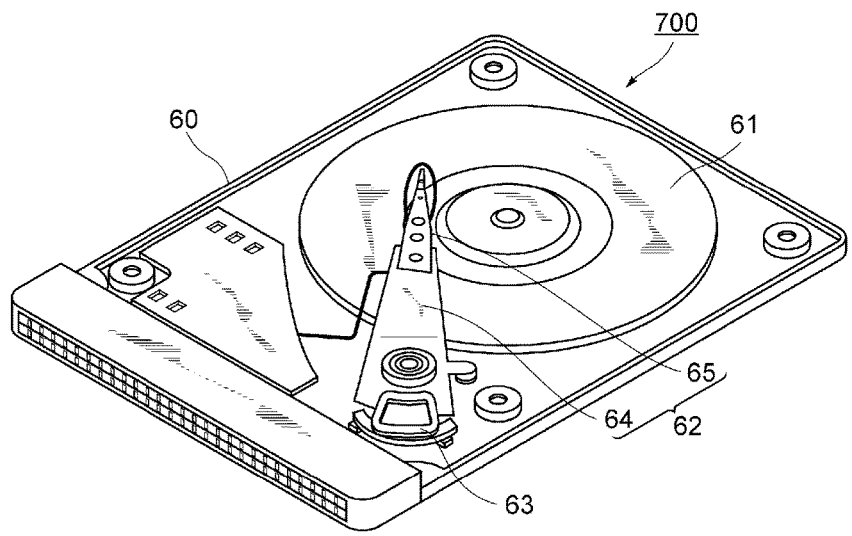
FIG. 5 is a view showing the configuration of a hard-disk drive in one embodiment of the present invention.

FIG. 5 is a view showing the configuration of a hard-disk drive provided with the head assembly as shown in FIG. 3A.

Inside the frame 60, the hard-disk drive 700 is provided with a hard disk 61 which functions as a recording medium and a head stack assembly 62 for recording the magnetic information in the hard disk 61 and replaying it. The hard disk 61 is forced to rotate by an electric motor not shown in the figure.

Head stack assembly 62 is an assembly formed by stacking several assembling articles in the depth direction of the figure, and the assembling article consists of actuator arm 64 and head assembly 65 connected with actuator arm 64, wherein actuator arm 64 is supported by voice coil motor 63 in a manner of that it can rotate freely around the spindle. Head slider 19 facing hard disk 61 is mounted on the front end part of head assembly 65 (see FIG. 4A).

In head assembly 65 (200), head element 19a adopt a changing form performed in two steps (FIG. 3A). A relatively large movement of the head element 19a is controlled by the driving involving all of head assembly 65 and actuator arm 64 according to voice coil motor 63 while a minor movement is controlled by the driving of head slider 19 according to the front end part of head assembly 65.

The piezoelectric film element used in head assembly 65 can prevent damages during preparation, thus, a higher reliability and sufficient accessibility will be provided.

(Ink Jet Printer)

Figure 6:
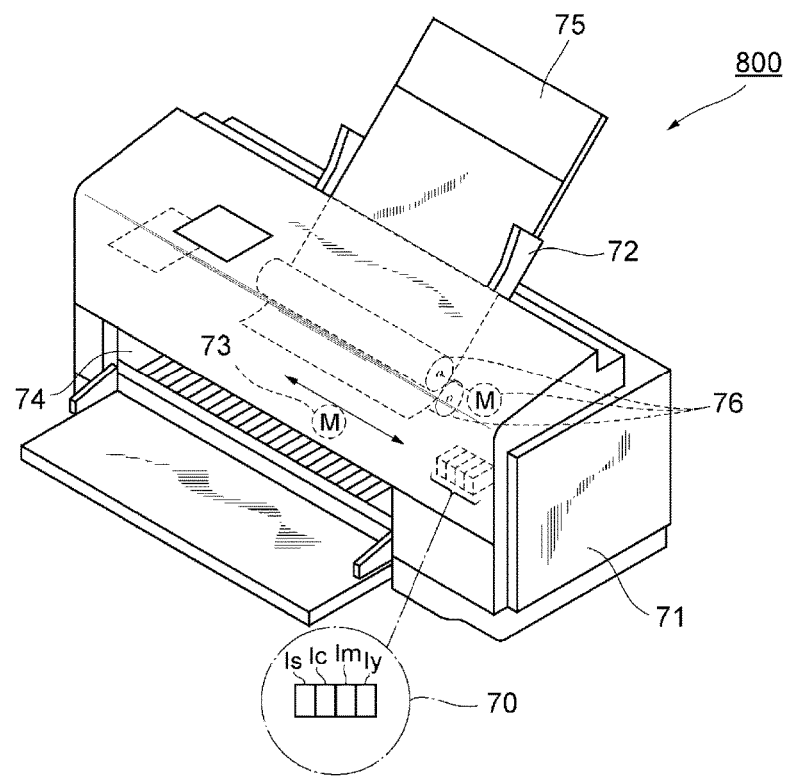
FIG. 6 is a view showing the configuration of an ink jet printer in one embodiment of the present invention.

FIG. 6 is a view showing the configuration of an ink jet printer provided with the ink jet printer head as shown in FIG. 3B.

Ink jet printer 800 mainly contains ink jet printer head 70, main body 71, tray 72 and head driving device 73. Piezoelectric actuator 300 is set inside ink jet printer head 70.

Ink jet printer 800 is provided with four ink cartridges of four colors, i.e., yellow, magenta, cyan and black, and can provide full-color printing. In addition, ink jet printer 800 has a dedicated control board or the like in the interior and controls the timing of ink jetting for ink jet printer head 70 and the scanning movement of head driving device 73. On the other hand, main body 71 has tray 72 on the back and also automatic sheet feeder 76 (a mechanism for automatically supplying sheets) in the interior. The automatic sheet feeder automatically sends recording sheet 75 and outputs recording sheet 75 from outlet 74 in the front side.

The piezoelectric film element used in the piezoelectric actuator of ink jet printer head 70 can prevent damages during preparation, thus, a higher reliability and a high safety will be provided.

Hereinbefore, the preferable embodiments are described, but the present invention is not limited to the mentioned embodiments. Various changes can be made in the range without departure from the spirit of the present invention. Obviously, these changes are contained in the present invention.

EXAMPLES

The present invention will be further described in detail based on Examples and Comparative Examples. However, the present invention is not limited to the following Examples.

Example 1

First, as the lower electrode layer, a Pt electrode layer was deposited on the single crystal Si substrate by a sputtering method. The condition during the deposition is set as follows, i.e., the substrate temperature was set as 400° C. and the film thickness was set as 0.2 μm.

Then, a target of $(K_{0.45}Na_{0.55})NbO_3$ was used to deposit a piezoelectric film with a same composition by the sputtering method on the Pt electrode layer. The film deposition was performed under a substrate temperature T1 of 720° C. from the starting of the deposition until the film thickness became 0.3 μm. Then the deposition was paused for once, and the substrate was kept at 720° C. for 1 hour. After that, the substrate temperature was changed to T2 of 800° C. and the deposition was continued until the film thickness became 2 μm. In addition, in the deposition, a mixed gas of argon and oxygen was used. The oxygen concentration during the deposition was fixed to be 10%.

Thereafter, an AFM was used to observe the surface shape in a view field of 10 μm×10 μm in an optional place on the surface of the piezoelectric film.

Then, the length X1 of the short side, the length Y1 of the long side of the first crystal, and the length X2 of the short side, the length Y2 of the long side of the second crystal in the observed field of view were calculated using the accessory photo software attached on the AFM. The ratio of the length Y1 of the long side when the length X1 of the short side is 1 in the first crystal, and the ratio of the length Y2 of the long side when the length X2 of the short side is 1 in the second crystal (i.e., the aspect ratios of Y1/X1 and Y2/X2 of the first crystal and the second crystal) were calculated respectively. The average value of the aspect ratios Y1/X1 and the average value of the aspect ratios Y2/X2 in the observed field of view were calculated. For each average value, optional five pairs of crossing first crystals and second crystals in the observed field of view were used as the objects.

The average value of long side Y1 of the first crystal and the average value of long side Y2 of the second crystal in the observed field of view were calculated respectively.

Further, the total area occupied by the first crystal and the second crystal in the surface of the piezoelectric film in the observed field of view was calculated and the total area ratio was calculated.

The number α of the first crystals and the number β of the second crystals in the surface of the piezoelectric film contained in the observed field of view were calculated and the ratio α/(α+β) was calculated.

After that, a Pt electrode layer was deposited by sputtering method as the upper electrode on the $(K_{0.45}Na_{0.55})NbO_3$ piezoelectric film. The condition during the deposition was set with the substrate temperature being 500° C. and the thickness of the film was 0.2 μm.

Further, a laminated structure on the substrate was patterned by photolithography and cut by dicing to provide a piezoelectric film element with the movable part having a size of 20 mm×1.0 mm.

After the preparation of the element, as consecutive driving test, a assumed sine wave drive voltage with the largest voltage being 5V was applied on the electrode layer of the piezoelectric film element which had been made into a product under 6 kHz for a billion times. In the applying of the voltage, a function generator (manufactured by NF Corporation) was used. In addition, before the consecutive driving test, the capacitance was measured using a LCR meter (manufactured by GOOD WILL INSTRUMENT CO., LTD.).

After the consecutive driving test, the capacitance value of the piezoelectric film element was measured again and the change rate ΔC of the capacitance was calculated. In addition, the change rate ΔC of the capacitance could be calculated from the formula of $\Delta C=\{1-(C2/C1)\}\times 100\%$ when the value of the capacitance before the consecutive driving test was set as C1 and the value of the capacitance after the consecutive driving test was set as C2.

The configurations of the piezoelectric film elements of Comparative example 1 and 2 and Examples 1 to 15, the preparation processes and the evaluation methods for them were all the same as Example 1. However, the heating condition of the substrate during the film deposition of the piezoelectric film in Examples 2 to 11 and Comparative examples 1 and 2 were different, and further in Examples 12 to 15, the compositions of the targets used in the film deposition were different. Thus, in the following, only the changed places in the film deposition condition of the piezoelectric film were described.

Comparative Example 1

The film deposition was performed under a substrate temperature of 800° C. from the starting of the deposition until film thickness became 0.3 μm. Then the deposition was paused for once, and the substrate was kept at 800° C. for 1 hour. After that, the substrate temperature was changed to 700° C. and the deposition was continued until the film thickness became 2 μm.

Comparative Example 2

The film deposition was performed under a substrate temperature of 480° C. from the starting of the deposition until the film thickness became 0.3 μm. Then the deposition was paused for once, and the substrate was kept at 480° C. for 1 hour. After that, the substrate temperature was changed to 700° C. and the deposition was continued until the film thickness became 2 μm.

Example 2

The film deposition was performed under a substrate temperature of 700° C. from the starting of the deposition until the film thickness became 0.3 μm. Then the deposition was paused for once, and the substrate was kept for 1 hour. After that, the substrate temperature was changed to 700° C. and the deposition was continued until the film thickness became 2 μm.

Example 3

The film deposition was performed under a substrate temperature of 520° C. from the starting of the deposition until the film thickness became 0.3 μm. Then the deposition was paused for once, and the substrate was kept at 520° C. for 1 hour. After that, the substrate temperature was changed to 700° C. and the deposition was continued until the film thickness became 2 μm.

Example 4

The film deposition was performed under a substrate temperature of 560° C. from the starting of the deposition until the film thickness became 0.3 μm. Then the deposition was paused for once, and the substrate was kept at 560° C. for 1 hour. After that, the substrate temperature was changed to 700° C. and the deposition was continued until the film thickness became 2 μm.

Example 5

The film deposition was performed under a substrate temperature of 560° C. from the starting of the deposition until the film thickness became 0.3 μm. Then the deposition was paused for once, and the substrate was kept at 560° C. for 1 hour. After that, the substrate temperature was changed to 650° C. and the deposition was continued until the film thickness became 2 μm.

Example 6

The film deposition was performed under a substrate temperature of 560° C. from the starting of the deposition until the film thickness became 0.3 μm. Then the deposition was paused for once, and the substrate was kept at 560° C. for 1 hour. After that, the substrate temperature was changed to 600° C. and the deposition was continued until the film thickness became 2 μm.

Example 7

The film deposition was performed under a substrate temperature of 720° C. from the starting of the deposition until the film thickness became 0.3 μm. Then the deposition was paused for once, and the substrate was kept at 720° C. for 1 hour. After that, the substrate temperature was changed to 580° C. and the deposition was continued until the film thickness became 2 μm.

Example 8

The film deposition was performed under a substrate temperature of 660° C. from the starting of the deposition until the film thickness became 0.3 μm. Then the deposition was paused for once, and the substrate was kept at 660° C. for 1 hour. After that, the substrate temperature was changed to 620° C. and the deposition was continued until the film thickness became 2 μm.

Example 9

The film deposition was performed under a substrate temperature of 660° C. from the starting of the deposition until the film thickness became 0.3 μm. Then the deposition was paused for once, and the substrate was kept at 660° C. for 1 hour. After that, the substrate temperature was changed to 600° C. and the deposition was continued until the film thickness became 2 μm.

Example 10

The film deposition was performed under a substrate temperature of 660° C. from the starting of the deposition until the film thickness became 0.3 μm. Then the deposition was paused for once, and the substrate was kept at 660° C. for 1 hour. After that, the deposition was continued until the film thickness became 2 μm.

Example 11

The film deposition was performed under a substrate temperature of 660° C. from the starting of the deposition until the film thickness became 0.3 μm. Then the deposition was paused for once, and the substrate was kept at 660° C. for 1 hour. After that, the substrate temperature was changed to 680° C. and the deposition was continued until the film thickness became 2 μm.

Example 12

A target of $(K_{0.45}Na_{0.55})(Nb_{0.9}Ta_{0.1})O_3$ was used to deposit a film in the same way as Example 1.

Example 13

A target of $(K_{0.45}Na_{0.55})(Nb_{0.95}Zr_{0.05})O_3$ was used to deposit a film in the same way as Example 1.

Example 14

A target wherein Mn was contained in an amount of 0.31 mass % in terms of MnO relative to the main component of $(K_{0.45}Na_{0.55})NbO_3$ was used to a film in the same way as Example 1.

Example 15

A target wherein Mn was contained in an amount of 0.31 mass % in terms of MnO relative to the main component of $(K_{0.45}Na_{0.55})(Nb_{0.85}Ta_{0.1}Zr_{0.05})O_3$ was used to a film in the same way as Example 1, wherein the Mn was added by adding 0.5 weight % of $MnCO_3$ when adding the starting materials.

For Examples 1 to 14 and Comparative Examples 1 and 2, the change rate ΔC of the capacitance before and after the consecutive driving test, and the average value of the aspect ratios Y1/X1 of the first crystals and the average value of the aspect ratios Y2/X2 of the second crystals calculated by surface observing were shown in Tables 1 to 5 respectively.

From Table 1, in the piezoelectric film element where a piezoelectric film with the first crystal and the second crystal crossing, the absolute value of the change rate ΔC of the capacitance is smaller than 20%. In addition, at the moment, it was confirmed that when the average aspect ratio is 2 or more, the change rate ΔC of the capacitance will shift to a tendency of decreasing and until the average aspect ratio became about 15, the change rate ΔC of the capacitance shifted in a similar extent. But in Example 3 where both of the average aspect ratios were 16, the change rate ΔC of the capacitance was increased. Thus, it was considered that the average aspect ratios were preferred to be 15 or less. In Comparative Example 1, in the surface of the piezoelectric film, the first crystals and the second crystals were slightly parallel to each other, and in Comparative Example 2, it was constructed by microscopic nano scale grains, and as a result, the first crystals and the second crystals could not be confirmed. In both of Comparative Example 1 and 2, the change rates ΔC were large, thus, it was assumed that in the piezoelectric film element using the piezoelectric film where the first crystals and the second crystals crossed, an effect of preventing the fatigue deterioration, i.e., an effect related to a high reliability could be obtained.

From Table 2, it could be confirmed that in the piezoelectric film where the first crystals and the second crystals crossed, even though the average aspect ratios were the same, there were a tendency that the shorter the average lengths of the long sides of the first crystals and the second crystals were, the smaller the change rate ΔC was. And to the largest extend, the change rate ΔC could be suppressed to about 5%. It was assumed that the shorter the length of the long side was, the higher effect of suppressing the extension of the potential cracks or the like could be achieved. As a result, a high reliability could be obtained.

From Table 3, it could be confirmed that in the piezoelectric film where the first crystals and the second crystals crossed, even though the average aspect ratios were similar, the larger the total area ratio of the first crystals and the second crystals in the field of view was, the smaller the change rate ΔC was. As its reason, it was assumed that the increasing of the ratio of the heteromorphy crystals which did not correspond to the present invention predicted a co-existing state of heterophases. The heterophases predicted an decreasing of the mechanical strength of the film. Thus, the fatigue deterioration of the piezoelectric film element was easy to be proceeded.

In Table 4, a tendency was shown that even in the piezoelectric film where the first crystals and the second crystals crossed and the average aspect ratios were similar, the closer to 1:1 the number α of the first crystals and the number β of the second crystals were, the smaller the change rate ΔC of the capacitance was. It was assumed that the extent of the uniform of the crossing first crystals and second crystals in the surface of the film would contribute to the decreasing of the damage.

It was confirmed that in Examples 12 to 15 where the compositions of the target were changed, the change rates ΔC of the capacitance caused by the consecutive driving test were small. From the results, it was confirmed that the same effects could be obtained even if the composition of the target used in the film-deposition was changed in the range of the KNN main component.

As shown above, controlling the surface state of the piezoelectric film in a proper state could contribute to a high reliability of the piezoelectric film element.

TABLE 1

|  | The change rate of the capacitance | the average value of the aspect ratios | |
|---|---|---|---|
|  | ΔC [%] | Y1/X1 | Y2/X2 |
| Example 1 | −19 | 1.7 | 1.8 |
| Example 2 | −7 | 2.4 | 2.5 |
| Example 3 | −13 | 16 | 16 |
| Example 4 | −9.2 | 14 | 13 |
| Comparative Example 1 | −41 | — | |

TABLE 1-continued

|  | The change rate of the capacitance | the average value of the aspect ratios | |
|---|---|---|---|
|  | ΔC [%] | Y1/X1 | Y2/X2 |
| Comparative Example 2 | −36 | — | |

TABLE 2

|  | The change rate of the capacitance | the average value of the aspect ratios | | The average value of the length of the long side | |
|---|---|---|---|---|---|
|  | ΔC [%] | Y1/X1 | Y2/X2 | Y1 | Y2 |
| Example 4 | −9.2 | 14 | 13 | 3.2 | 1.8 |
| Example 5 | −7.8 | 14 | 13 | 2.3 | 2.3 |
| Example 6 | −5.4 | 14 | 14 | 1.7 | 1.7 |

TABLE 3

|  | The change rate of the capacitance | the average value of the aspect ratios | | The total area ratio |
|---|---|---|---|---|
|  | ΔC [%] | Y1/X1 | Y2/X2 | S(%) |
| Example 1 | −19 | 1.7 | 1.8 | 65 |
| Example 7 | −14 | 1.6 | 1.4 | 73 |

TABLE 4

|  | The change rate of the capacitance | the average value of the aspect ratios | | The ratio of the first crystal |
|---|---|---|---|---|
|  | ΔC [%] | Y1/X1 | Y2/X2 | $\alpha/(\alpha + \beta)$ |
| Example 8 | −5 | 5.2 | 5.3 | 0.72 |
| Example 9 | −2.8 | 4.1 | 4.1 | 0.68 |
| Example 10 | −4.2 | 4.8 | 4.8 | 0.31 |
| Example 11 | −5.7 | 5.4 | 5.2 | 0.27 |

TABLE 5

|  | The change rate of the capacitance | the average value of the aspect ratios | | |
|---|---|---|---|---|
|  | ΔC [%] | Y1/X1 | Y2/X2 | Composition |
| Example 1 | −19 | 1.7 | 1.8 | (K0.45Na0.55)NbO3 |
| Example 12 | −13 | 1.7 | 1.5 | (K0.45Na0.55)(Nb0.9Ta0.1)O3 |
| Example 13 | −17 | 1.2 | 1.1 | (K0.45Na0.55)(Nb0.95Zr0.05)O3 |
| Example 14 | −16 | 1.3 | 1.4 | (K0.45Na0.55)NbO3 + 0.5 wt % MnCO3 |
| Example 15 | −11 | 1.8 | 1.9 | (K0.45Na0.55)(Nb0.85Ta0.1Zr0.05)O3 + 0.5 wt % MnCO3 |

DESCRIPTION OF REFERENCE NUMERALS

100 Piezoelectric film element
1 Substrate
2 Lower electrode layer
3 Piezoelectric film
4 Upper electrode
10 Surface of the piezoelectric film
10a-10d crystals
D1 First orientation
D2 Second orientation
200 Head assembly
9 Base plate
11 Load beam
11b End part
11c First plate spring part
11d Second plate spring part
11e Opening part
11f Main part of beam
15 Flexible substrate
17 Flexure
19 Head slider
19a Head element
300 Piezoelectric actuator
20 Substrate
21 Pressure chamber
23 Insulating film
24 Lower electrode layer
25 Piezoelectric film
26 Upper electrode layer
27 Nozzle
400 Gyro sensor
110 Substrate
120, 130 Arm
30 Piezoelectric film
31 Upper electrode
31a, 31b Driving electrode layer
31c, 31d Detecting electrode layer
32 Lower electrode
500 Pressure sensor
40 Piezoelectric film element
41 Common electrode layer
42 Piezoelectric film
43 Individual electrode layer
44 Supporter
45 Hollow space
46 Current amplifier
47 Voltage detector
600 Pulse wave sensor
50 Piezoelectric film element
51 Common electrode layer
52 Piezoelectric film
53 Individual electrode layer
54 Supporter
55 Voltage detector
700 Hard-disk drive
60 Frame
61 Hard-disk
62 Head stack assembly
63 voice coil motor
64 Actuator arm
65 Head assembly
800 Ink jet printer 70 Ink jet printer head
71 Main body
72 Tray
73 Head driving device
74 Outlet
75 Recording sheet
76 Automatic sheet feeder (a mechanism for automatically supplying sheets)

What is claimed is:

1. A piezoelectric film comprising (K,Na)NbO$_3$ as the main component, wherein,
    when a surface of the piezoelectric film is observed in an observed field of view within a specified range, a plurality of first crystals and a plurality of second crystals are arranged on the surface of the piezoelectric film, wherein, the first crystal has a slender shape orientating towards a first orientation along the surface, and the second crystal has a slender shape orientating towards a second orientation which crosses with the first orientation along the surface.

2. The piezoelectric film of claim 1, wherein,
    an average value of a first aspect ratio showing a ratio of a length of a long side relative to a length of a short side of the first crystal is 2 or more, and
    an average value of a second aspect ratio showing a ratio of a length of a long side relative to a length of a short side of the second crystal is 2 or more.

3. The piezoelectric film of claim 2, wherein, both of an average value of the first aspect ratio and an average value of the second aspect ratio are in a range of 2 or more and 15 or less.

4. The piezoelectric film of claim 1, wherein,
    both of an average length of a long side of the first crystal and an average length of a long side of the second crystal are 2 μm or less.

5. The piezoelectric film of claim 1, wherein,
    a total area ratio of the first crystals and the second crystals is 70% or more when the surface of the piezoelectric film is observed in an observed field of view within a specified range.

6. The piezoelectric film of claim 1, wherein,
    the ratio $\alpha/(\alpha+\beta)$ is 0.3 or more and 0.7 or less when the surface of the piezoelectric film is observed in an observed field of view within a specified range, wherein $\alpha$ represents the number of the first crystals, $\beta$ represents the number of the second crystals, and $\alpha/(\alpha+\beta)$ represents the ratio of a relative to the sum of $\alpha$ and $\beta$.

7. The piezoelectric film of claim 1, wherein,
    at least one selected from the group consisting of Ta, Mn and Zr is further contained in the piezoelectric film.

8. A piezoelectric film element containing the piezoelectric film of claim 1 and a pair of electrode layers which sandwich the piezoelectric film.

9. A piezoelectric actuator using the piezoelectric film element of claim 8.

10. A piezoelectric sensor using the piezoelectric film element of claim 8.

11. An ink jet printer head comprising the piezoelectric actuator of claim 9.

12. A hard disk drive comprising the piezoelectric actuator of claim 9.

* * * * *